United States Patent [19]
Kim

[11] Patent Number: 5,971,768
[45] Date of Patent: Oct. 26, 1999

[54] METHODS OF FABRICATING INTEGRATED CIRCUIT TRENCH ISOLATION REGIONS

[75] Inventor: Yoon-gi Kim, Kangwon-do, Rep. of Korea

[73] Assignee: Samsung Electronics Co., Ltd., Suwon, Rep. of Korea

[21] Appl. No.: 08/657,981

[22] Filed: May 29, 1996

[30] Foreign Application Priority Data

May 29, 1995 [KR] Rep. of Korea ...................... 95-13690

[51] Int. Cl.⁶ .................................................. H01L 21/76
[52] U.S. Cl. ................................ 437/67; 437/69; 437/61; 437/73
[58] Field of Search ................................ 437/67, 61, 69, 437/70, 72, 73

[56] References Cited

U.S. PATENT DOCUMENTS

| | | | |
|---|---|---|---|
| 4,331,708 | 5/1982 | Hunter | 437/68 |
| 4,334,348 | 6/1982 | Trenary et al. | 148/DIG. 50 |
| 4,630,343 | 12/1986 | Pierce et al. | 437/67 |
| 4,868,136 | 9/1989 | Ravaglia | 437/67 |
| 5,308,784 | 5/1994 | Kim et al. | 148/DIG. 50 |
| 5,360,753 | 11/1994 | Park et al. | 437/67 |

Primary Examiner—Trung Dang
Attorney, Agent, or Firm—Bell, Seltzer, Park & Gibson

[57] ABSTRACT

Narrow trenches are formed in an integrated circuit substrate. An insulation layer, preferably silicon dioxide, is formed on the substrate, a mask region, preferably silicon nitride, formed on the insulation layer, and portions of the insulation layer adjacent and underlying edge portions of the mask region removed to undermine edge portions of the mask region and leave a portion of the insulation layer underlying the mask region. A semiconductor layer, preferably polysilicon, is then formed on the substrate, extending to underlie undermined portions of the mask region, and then selectively oxidized to leave a semiconductor region underlying the mask region and form an insulation region disposed adjacent the semiconductor region. The mask region is then removed to expose the semiconductor region and the remaining portion of the insulation layer. The semiconductor region and underlying portions of the substrate are then removed to form a trench between the insulation region and the remaining portion of the insulation layer. The trench preferably is filled by forming a field insulation layer on the substrate. One portion of the field insulation layer and one portion of the remain portion of the insulation layer surrounded by an insulation-filled trench region may be removed to thereby form one active region site surrounded by a insulation-filled trench, or a plurality of portions of each layer bordered by an insulation-filled trench region may be removed to form a plurality of active region sites partially bordered by the insulation-filled trench region.

21 Claims, 6 Drawing Sheets

METHODS OF FABRICATING INTEGRATED CIRCUIT TRENCH ISOLATION REGIONS

FIELD OF THE INVENTION

The present invention relates to integrated circuit fabrication methods, more particularly, to methods of fabricating device isolation regions in integrated circuits.

BACKGROUND OF THE INVENTION

Increasing the density of integrated circuit devices generally requires reduction of the size of the transistors used in the devices in order to incorporate more transistors into the integrated circuit. To reduce the size of the transistors, it is generally desirable to reduce the area of the active regions in the integrated circuit. In addition, it generally is desirable to reduce the area of the device isolation regions used to separate the active regions of the integrated circuit.

One technique for forming device isolation regions involves the local oxidation of silicon (LOCOS). According to this technique, an insulating oxide layer is grown between active regions by thermally oxidizing silicon substrate regions between the active regions. However, as the oxidation process tends to extend laterally across the face of the substrate as well as vertically into the regions, so called "bird's beaks" may be produced at the edges of the active regions which may encroach on and undesirably narrow the active regions. In addition, the field oxide layers formed in wider device isolation regions tend to be thicker than those formed in narrower device isolation regions, making it difficult to achieve the desired oxide thickness in some areas of the substrate.

An alternative to the LOCOS techniques is a trench isolation method whereby a photolithographic mask is used to define boundaries of a trench on a substrate surface surrounding an active region and trenches are etched into the substrate according to the mask. The trenches are then filled with an insulating material such as a deposited silicon dioxide to form a device isolation region. To reduce separation between active regions, the trenches generally must be very narrow. However, the narrowness of trenches tends to be limited by the resolution available using conventional photolithography techniques, i.e., it is generally difficult to reliably produce a sufficiently narrow photoresist pattern. In addition, it may be difficult to form trenches sufficiently deep to provide the necessary isolation because of the difficulty of filling narrow, deep trenches without producing voids or other defects.

For this reason, trench isolation may be augmented by forming a local field oxide in conjunction with a filled trench. FIG. 1 illustrates active regions 12 defined on a semiconductor substrate using combined trench/LOCOS isolation according to the prior art, by an isolation region including a trench region 10 and a field region 13. As illustrated by FIG. 2, representing a cross-section of the substrate taken along a line D-D' of FIG. 1, a trench region 10 is formed between active regions 12 filled with a material 14 such as polysilicon or silicon dioxide, over which the field oxide region 13 is formed. The minimum width A of the isolation field region 14 defining active region 12 generally is the sum of twice the distance C between the edges of the trench 10 and the active regions 12, and the trench width B. Although reducing the width B of the trench region 10 can reduce the overall width A of the isolation region 14, the reduction achievable is generally limited by the minimum resolution of the photolithography. In addition, by using local oxidation, bird's beaks 16 may be formed which may encroach on the active regions 12.

SUMMARY OF THE INVENTION

In light of the foregoing, it is an object of the present invention to provide methods for fabricating device isolation regions for integrated circuit which allow decreased separation between active regions in the integrated circuit.

It is another object of the present invention to provide methods for fabricating device isolation regions which include trench regions narrower than formed using conventional trench lithography.

It is another object of the present invention to form trench regions in semiconductor substrates which can be narrower than the resolution of conventional photolithographic techniques.

These and other objects, features and advantages are provided according to the present invention, by methods for fabricating trenches in an integrated circuit substrate in which a narrow semiconductor region is formed underneath edge portions of a mask region formed on the substrate, and the semiconductor region and underlying portions of the substrate are removed using adjacent insulation regions as a mask. The semiconductor region may be formed by undermining an insulation layer from beneath edge portions of the mask region, filling underneath the undermined edge portions with a semiconductor layer, and selectively oxidizing the semiconductor layer to leave a semiconductor region underlying the mask region. An insulation-filled trench region may be formed by forming a field insulation layer on the substrate to fill the trench, and an active region site formed by removing portions of the field insulation layer bounded by the insulation-filled trench region. Each active region site may be surrounded by an insulation-filled trench, or, according to a combined trench/field isolation aspect, a combination of insulation-filled trench regions and field insulation regions may be used to separate active region sites.

By undermining the edges of a mask region and then backfilling the undermined area to form a trench, the present invention can provide narrower trenches than obtainable by direct photolithography of a trench structure on the substrate. The thickness of the trench may be controlled by controlling the depth of the insulation layer on the substrate, while the width of the trench may be controlled by controlling the extent to which the mask region is undermined and the extent to which the semiconductor layer is oxidized. An active region site bordered by the trench may then be formed using conventional lithographic and etching techniques, without requiring local oxidation around the site. The combined trench/field isolation aspect provides for increased photolithographic margins while maintaining reduced separation between active region sites.

In particular, according to the present invention, to fabricate trenches in an integrated circuit substrate, an insulation layer is formed on the substrate. A mask region is then formed on the substrate, and portions of the insulation layer adjacent and underlying edge portions of the mask region removed to thereby undermine edge portions of the mask region and leave a portion of the insulation layer underlying the mask region. A semiconductor region and an insulation region are then formed, the semiconductor region positioned beneath undermined portions of the mask region and adjacent the remaining portion of the insulation layer and the insulation region positioned adjacent the semiconductor region, opposite the remaining portion of the insulation layer. The mask region is then removed to expose the semiconductor region and the remaining portion of the insulation layer. The semiconductor region and underlying portions of the substrate are then removed to form a trench between the insulation region and the remaining portion of the insulation layer, the trench extending into the substrate.

The mask region may be formed by forming a second insulation layer on the insulation layer, and removing portions of the second insulation to form a mask region on the first insulation layer. The semiconductor region may be formed by forming a semiconductor layer on the substrate extending to underlie undermined portions of the mask region, preferably at least halfway up sidewall portions of the remaining portion of the insulation layer, and then selectively oxidizing the semiconductor layer to leave a semiconductor region underlying the mask region and form an insulation region disposed adjacent the semiconductor region, opposite the remaining portion of the insulation layer. The insulation layer preferably includes silicon dioxide, the second insulation layer and the mask region preferably include silicon nitride, the semiconductor layer and the semiconductor region preferably comprise polysilicon, and the insulation region preferably comprises oxidized polysilicon.

To form an insulation filled trench region between the insulation region and the remaining portion of the insulation layer, the trench is filled with an insulating material, preferably by forming a field insulation layer on the substrate to thereby fill the trench. To form an active region site, portions of the field insulation layer and portions of the remaining portion of the insulation layer bordered by an insulation-filled trench are then removed to expose the substrate. One portion of the field insulation layer and one portion of the remaining portion of the insulation layer surrounded by an insulation-filled trench may be removed to thereby form one active region site surrounded by a insulation-filled trench, or, according to a combined trench/field isolation aspect, a plurality of portions of the field insulation layer and a corresponding plurality of portions of the remaining portion of the insulation layer bordered by an insulation-filled trench region may be removed to form a plurality of active region sites partially bordered by the insulation-filled trench region. Narrow insulation-filled trench regions are thereby provided.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION

Figure 1:
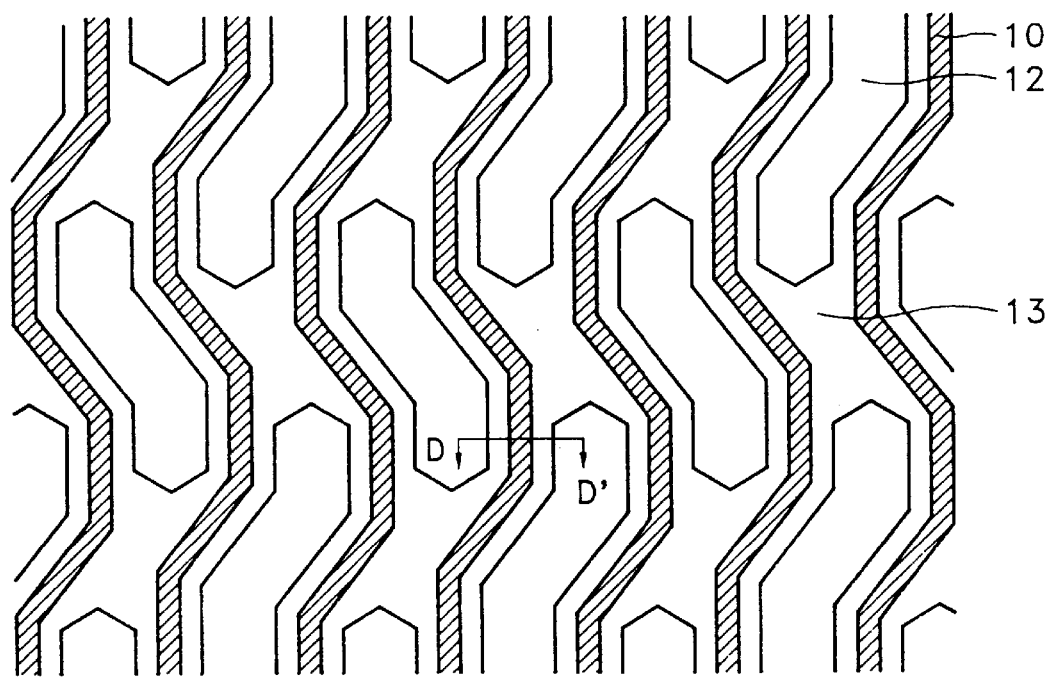
FIG. 1 is a plan view illustrating a combined trench isolation/field isolation technique according to the prior art.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Figure 6:
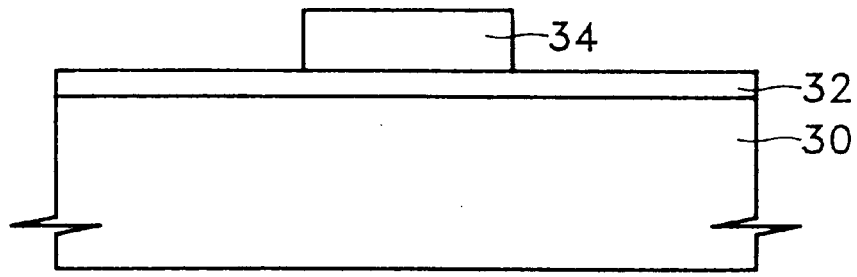
FIG. 6 is a cross-sectional view illustrating operations for forming a masking region on a substrate according to the present invention.

Illustrative operations for forming trenches in an integrated circuit substrate according to the present invention are illustrated in FIGS. 6–10. In FIG. 6, a masking region 34 is formed on an insulation layer 32 on the substrate 30. Specifically, the insulation layer 32 may be formed on the substrate 30, preferably as a deposited silicon dioxide film having a thickness comparable to that of buffered silicon dioxide films commonly used in LOCOS techniques, approximately 100 Å to 500 Å. Subsequently, a second insulation layer may be formed on the first insulation layer 32, preferable a silicon nitride film having a thickness of 1,000 Å to 2,500 Å. The second insulation layer is then patterned, for example, using conventional photolithography and etching techniques, to produce a mask region 34 on the insulation layer 32.

Figure 7:
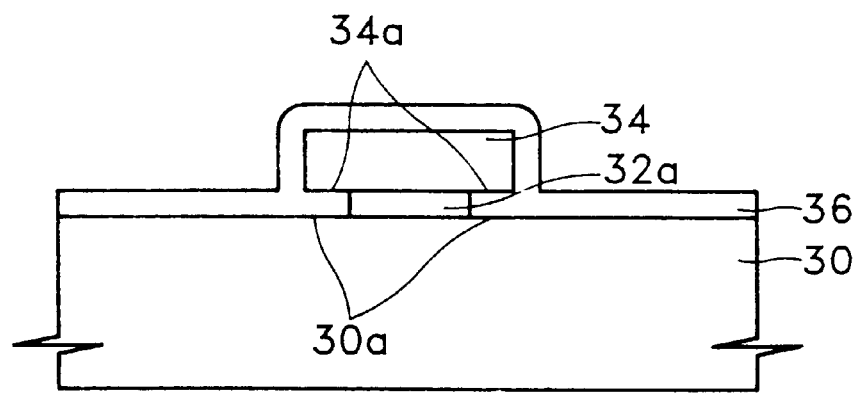
FIG. 7 is a cross-sectional view illustrating operations for undermining edge portions of a mask region and forming a semiconductor layer filling beneath undermined portions of the mask region according to the present invention.

FIG. 7 illustrates operations for undermining edge portions of the mask region 34 to leave a portion 32a of the insulation layer 32 underlying the mask region 34, and backfilling beneath the undermined edge portions with a semiconductor layer 36. Portions of the insulation layer adjacent and underlying edge portions 34a the masking region 34 are removed, preferably by isotropically etching using wet-etching or chemical dry-etching techniques, thereby leaving a portion 32a of the insulation layer 32 underlying the masking region 34. The insulation layer 32 preferably is removed approximately 200 Å to 2,000 Å underneath the masking region 34. The extent of the undermining can be used to control the width of the trench which is subsequently formed.

After undermining of the edge portions 34a of the mask region 34, a semiconductor layer 36, preferably polysilicon, is formed on the substrate 30, covering the exposed substrate 30a beneath the undermined edge portions of the mask region 34. Those skilled in the art will understand that the cavity beneath the undermined edge portions need not be entirely filled. Preferably, the semiconductor layer 36 extends from the exposed substrate surface 30a at least halfway up sidewall portions of the remaining portion 32a of the insulation layer, to ensure that the exposed substrate surface 30a is covered.

Figure 8:
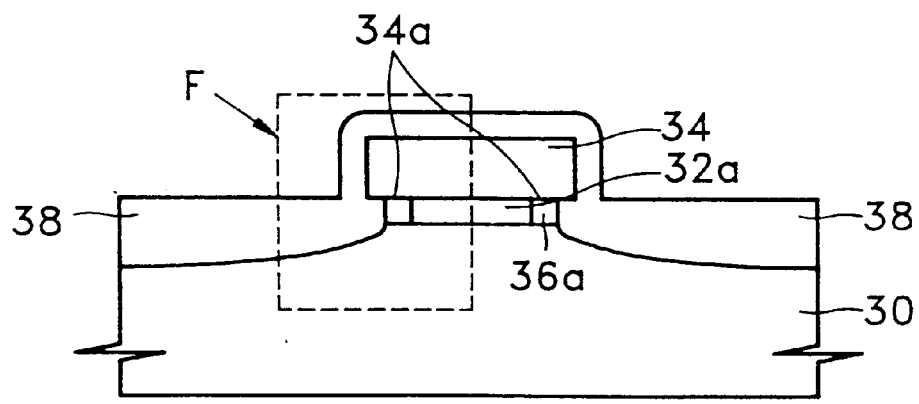
FIG. 8 is a cross-sectional view illustrating operations for oxidizing a semiconductor layer to leave a semiconductor region adjacent insulation regions underlying portions of a mask region according to the present invention.

FIG. 8 illustrates operations for forming a semiconductor region 36a underlying undermined portions of the mask region 34, as part of a process of forming a narrow mask for trench formation. The semiconductor layer 36 is selectively oxidized, preferably thermally, with the extent of the oxidation controlled to oxidize outer portions of the semiconductor layer 36 while leaving an unoxidized semiconductor region 36a underlying the mask region 34. As thermal oxidation generally proceeds vertically into the substrate at a higher rate than the rate it proceeds laterally across the substrate, the oxidized portion 38 may be thicker than the unoxidized semiconductor region 36a underlying the mask region 34. The oxidation may extend underneath the edge portions 34a of the mask region 34 while still leaving the unoxidized semiconductor region 36a under the mask region 34. A box F indicates the interface of the semiconductor region 36a, the oxidized portion 38 of the semiconductor layer 36, and the remaining portion 32a of the insulation layer 32, discussed in greater detail below.

Figure 9:
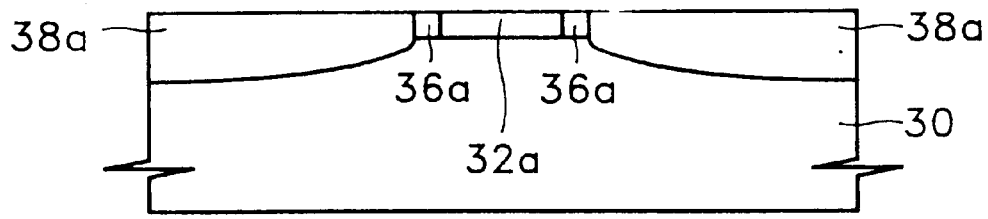
FIG. 9 is a cross-sectional view illustrating operations for exposing the semiconductor region and adjacent insulation regions according to the present invention.

FIG. 9 illustrates operations for forming an insulation region 38a adjacent the unoxidized semiconductor region 36a, and for exposing the semiconductor region 36a and the remaining portion 32a of the insulation layer underlying the mask region 34. Portions of the oxidized portion 38 of the semiconductor layer 36 are removed, preferably by isotropic etching using wet-etching or a chemical dry-etching techniques, to expose the mask region 34, and to form the insulation region 38. Then the mask region 34 is removed, preferably by a phosphoric acid etchant, to expose the semiconductor region 36a and the remaining portion 32a of the insulation layer.

Figure 10:
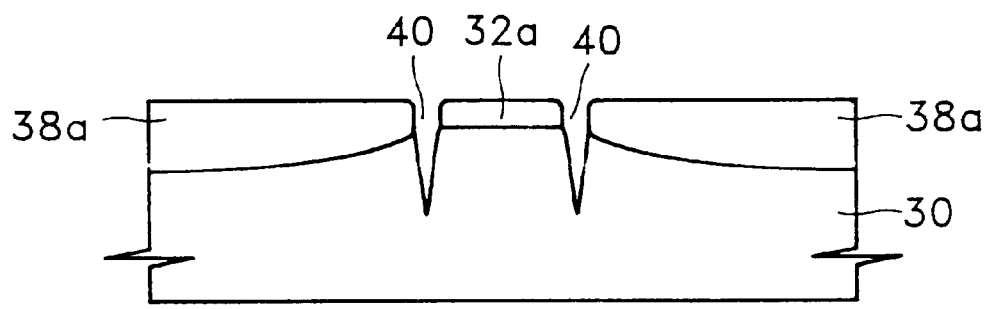
FIG. 10 is a cross-sectional view illustrating operations for removing the semiconductor region and portions of the underlaying substrate to form a trench according to the present invention.

FIG. 10 illustrates operations for forming a trench 40 in the substrate 30. The unoxidized semiconductor region 36a and underlying portions of the substrate are removed using the adjacent insulation region 38a and the remaining portion 32a of the insulation layer 32 as a mask, preferably by sequential etching steps. Since both the unoxidized semiconductor region 36a and the underlying substrate 30 are preferably silicon, sequential etching may be performed, with the width of the resulting trench 40 approximating the width of the semiconductor region 36a. Those skilled in the art will understand that the etching depth can be varied; preferably, the trench 40 is etched to a depth at least three times deeper than that of the semiconductor junctions employed in the active regions of the integrated circuit, in order to achieve the desired isolation characteristics.

Those skilled in the art will understand that the above steps are generally applicable to forming narrow trenches in a substrate, and are not limited to forming device isolation regions. Those skilled in the art will also understand that the regions corresponding to the mask region, the semiconductor region and the remaining portion of the insulation layer may be formed from other materials such that differences in etching rates will similarly allow etching away of the material region corresponding to the desired trench using adjacent material regions as a mask. For example, the region overlying a trench location could be formed from a first type of metal, while the adjacent regions masking the trench may be formed from a different type of metal exhibiting different etching characteristics.

Figure 11:
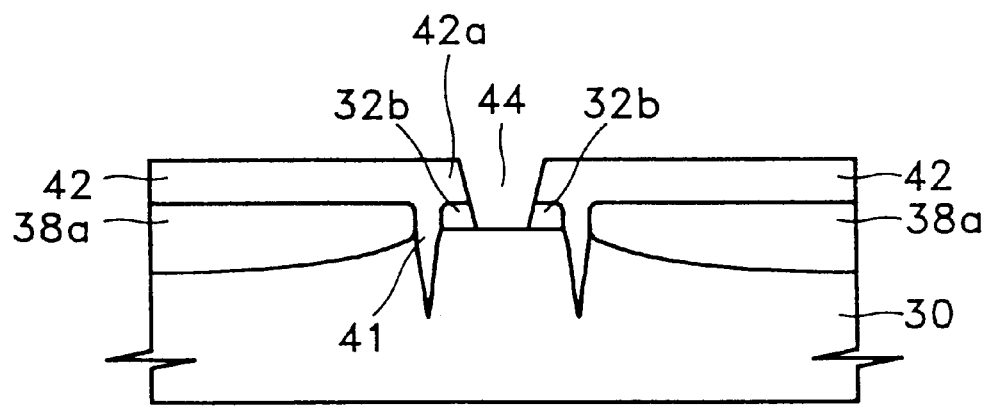
FIG. 11 is a cross-sectional view illustrating operations for forming an active region site according to the present invention.

FIG. 11 illustrates operations for forming an active region site 44 bordered by an isolation region which includes an insulation-filled trench region 41. A field insulation layer is formed on the substrate 30, preferably a silicon dioxide layer formed by chemical vapor deposition (CVD). The field insulation layer fills the trench 40, forming an insulation-filled trench region 41. Portions of the field insulation layer and underlying portions of the remaining portion 32a of the insulation layer bordered by the insulation-filled trench region 41 may then be removed to form an active region site 44 on the substrate 30, bordered by a device isolation region including an inner field insulation region 42a and the insulation-filled trench 41. Further isolation may be provided by the combination of the insulation region 38a and an outer field insulation region 42. Preferably, the field insulation layer and the remaining portion 32a of the insulation layer 32 are isotropically etched using a wet etching technique which causes the edges of the inner field insulation region 42a and the outer field insulation region 42 to be rounded, a feature which may be advantageous in subsequent integrated circuit fabrication steps.

Figure 3:
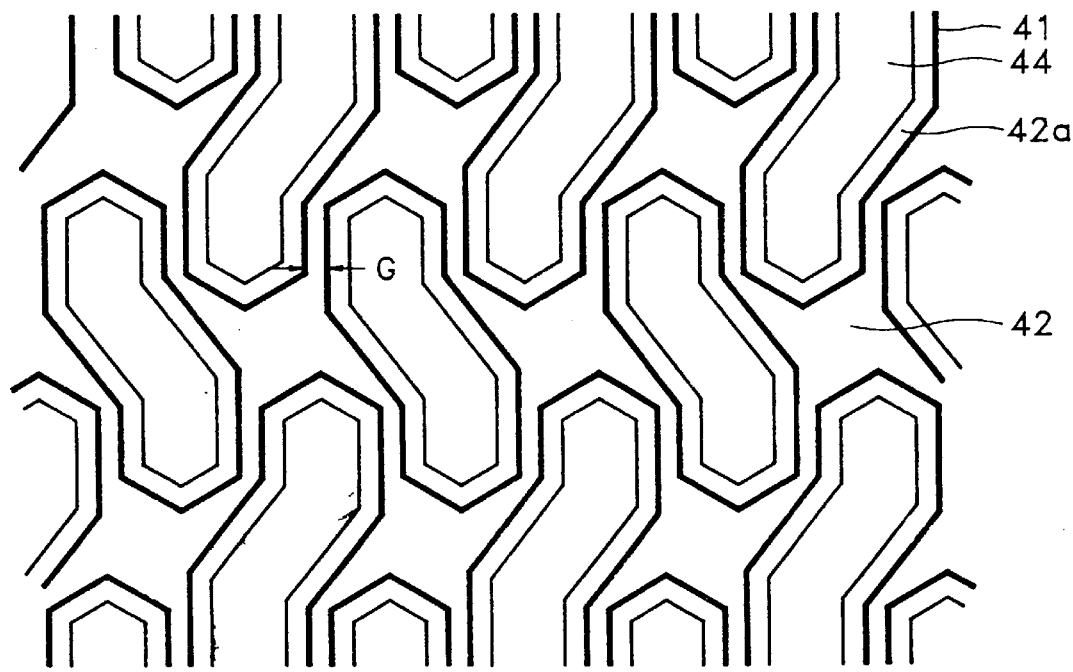
FIGS. 3–5 are plan views showing active region sites defined by isolation regions on a semiconductor substrate according to the present invention.
Figure 2:
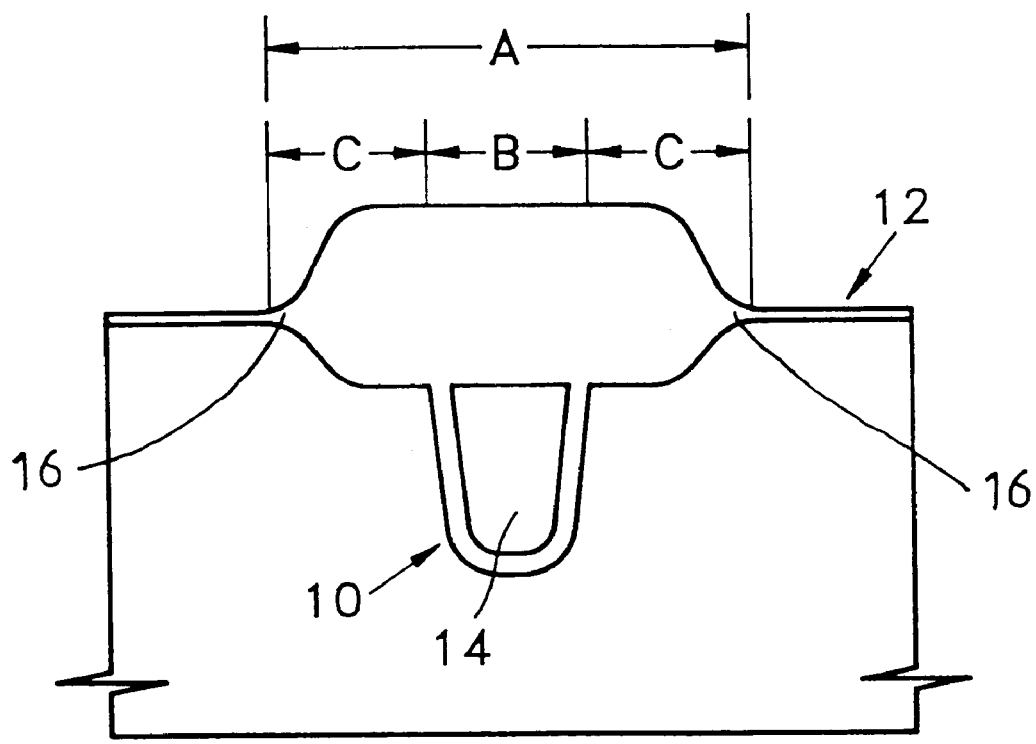
FIG. 2 is a cross-sectional view illustrating a combined trench isolation/field isolation technique according to the prior art.
Figure 4:
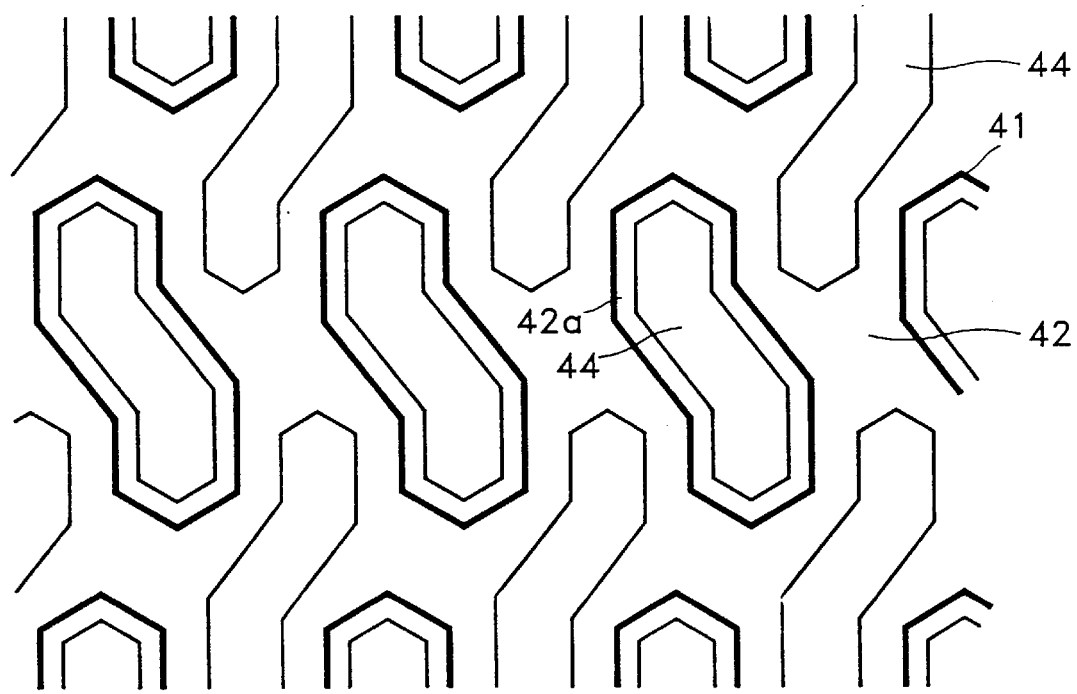
Figure 5:
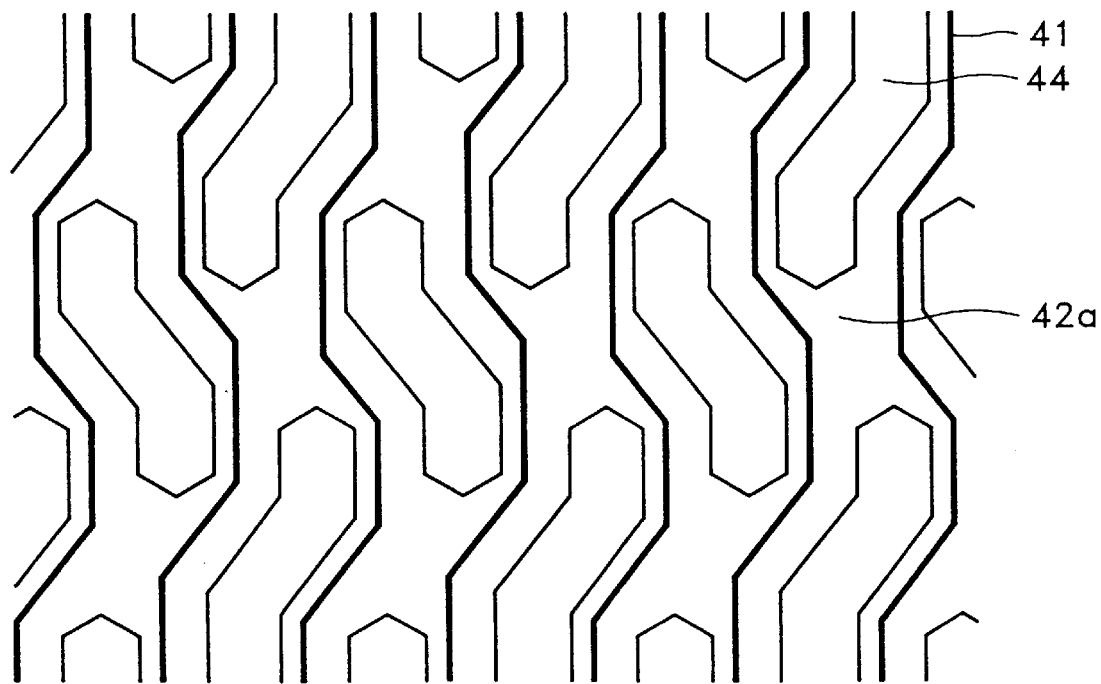

FIGS. 3–5 illustrate various layouts for active region sites and device isolation regions according to the present invention. FIG. 3 illustrates a plurality of active region sites 44, each surrounded by a narrow insulation-filled trench region 41 and an intervening inner field insulation region 42a. The insulation-filled trench regions 41 are separated by outer field insulation regions 42. Using the layout of FIG. 3, if the insulation-filled trench regions 41 are closely spaced to increase integration, short spacing G between adjacent structures may lead to decreased photolithograhic margins and associated fabrication difficulties.

To achieve close spacing between active region sites while increasing the photolithographic margin between adjacent structures, the configurations illustrated in FIG. 4 and FIG. 5 may be adopted. In FIG. 4, insulation-filled trench regions 41 are formed surrounding alternate ones of the active region sites 44, instead of surrounding each active region site as in FIG. 3. The portions of the outer field insulation regions 42 separating the unsurrounded active region sites from the surrounded active region sites preferably are wider than the combination of the insulation-filled trenches 41 and the inner field insulation regions 42a, to achieve desirable isolation characteristics. The layout of FIG. 5 similarly takes advantage of staggered trenches, by forming a plurality of active region sites between two insulation-filled trench regions 41, and separating the active region sites in each row by relatively wide portions of inner field insulation regions 42a.

By alternating the placement of the insulation-filled trench regions 41 as illustrated in FIGS. 4 and 5, greater photolithographic margins may be provided while achieving high levels on integration. Those skilled in the art will understand, however, that a variety of other layouts may be used with the present invention. For example, active region sites having shapes other than those in the illustrated embodiments, or sites arranged in different configurations, may be used with the present invention.

Figure 12:
FIG. 12 is a TEM photomicrograph illustrating selective oxidation of a semiconductor layer to leave a semiconductor region underlying a mask region according to the present invention.

FIGS. 12–14B are photomicrographs illustrating features of device isolation regions fabricated according to the present invention. In FIG. 12, a tunnel electron microscope (TEM) photomicrograph of the portion of a substrate corresponding to the outline box F of FIG. 8, a 240 Å thick insulation layer 32 is etched to undermine a masking region 34 having a thickness of approximately 1,500 Å. As illustrated, even when the semiconductor layer 36 is formed to a thickness of approximately 1,000 Å and oxidized to form an oxidized polysilicon region 38 having a thickness of approximately 4,000 Å, an unoxidized polysilicon region 36a still remains beneath the masking region 34.

Figure 13:
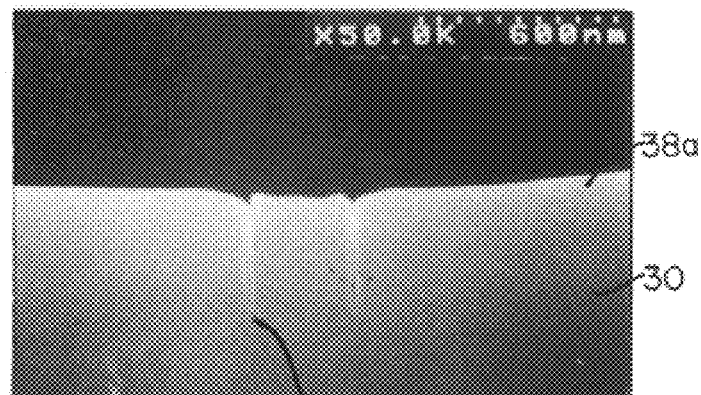
FIG. 13 is an SEM photomicrograph illustrating a trench formed according to the present invention.
Figure 14A:
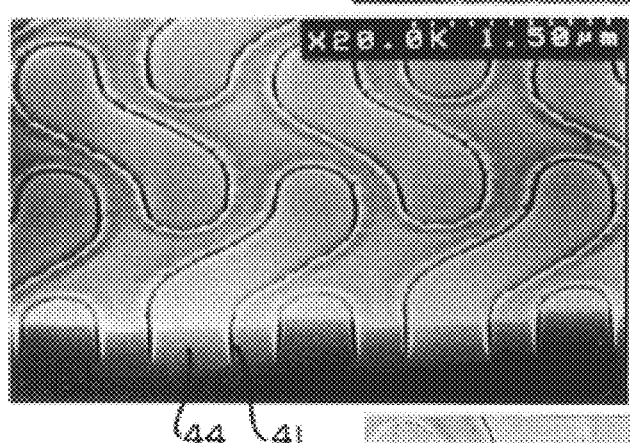
FIG. 14A–B are SEM photomicrographs illustrating device isolation regions and active region sites formed according to the present invention.
Figure 14B:
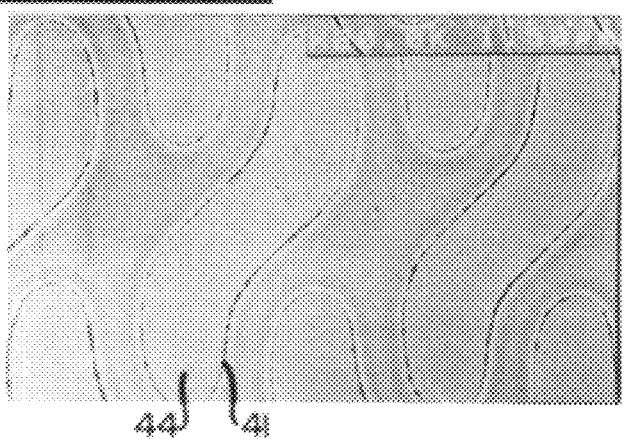

FIG. 13 is a scanning electron microscope (SEM) photomicrograph illustrating a section of a trench 40 formed in a substrate 30 according to the present invention, adjacent an insulation region 38a. The trench 40 has a width of approximately 50 nanometers and a depth of approximately 3,000 Å. The present invention thus is shown to produce trenches narrower than the limits of conventional trench photolithography, which typically is capable of patterning a minimum trench width of approximately 3,000 Å for i-line exposures. FIGS. 14A and 14B are SEM photomicrographs illustrating insulation-filled trench regions 41 defining active regions 44, viewed from the top of a substrate.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A method of fabricating trenches in an integrated circuit substrate, the method comprising the steps of:
    forming an insulation layer on the substrate;
    forming a mask region on the insulation;
    removing portions of the insulation layer adjacent and underlying edge portions of the mask region to thereby undermine edge portions of the mask region and leave a portion of the insulation layer underlying the mask region;
    forming a semiconductor region and an insulation region, the semiconductor region positioned beneath undermined portions of the mask region and adjacent the remaining portion of the insulation layer and the insulation region positioned adjacent the semiconductor region, opposite the remaining portion of the insulation layer;
    removing the mask region to expose the semiconductor region and the remaining portion of the insulation layer; and
    removing the semiconductor region and underlying portions of the substrate to form a trench between the insulation region and the remaining portion of the insulation layer, the trench extending into the substrate.

2. A method according to claim 1 wherein said step of forming a mask region comprises the steps of:
    forming a second insulation layer on the insulation layer; and
    patterning the second insulation to form a mask region on the first insulation layer.

3. A method according to claim 1 wherein said step of forming a semiconductor region comprises the steps of:
    forming a semiconductor layer on the substrate, extending to underlie undermined portions of the mask region; and
    selectively oxidizing portions of the semiconductor layer to leave a semiconductor region underlying the mask region, and to form an insulation region disposed adjacent the semiconductor region, opposite the remaining portion of the insulation layer.

4. A method according to claim 1 wherein the insulation layer comprises silicon dioxide and the mask region comprises silicon nitride.

5. A method according to claim 2 wherein the insulation layer comprises silicon dioxide and the second insulation layer comprises silicon nitride.

6. A method according to claim 1 wherein the semiconductor region comprises polysilicon.

7. A method according to claim 3 wherein the semiconductor layer and the semiconductor region comprise polysilicon, and the insulation region comprises oxidized polysilicon dioxide.

8. A method according to claim 7 wherein said step of forming a semiconductor layer comprises the step of forming a semiconductor layer on the substrate extending at least halfway up sidewall portions of the remaining portion of the insulation layer.

9. A method according to claim 1 further comprising the step of filling the trench with an insulating material to form an insulation-filled trench between the insulation region and the remaining portion of the insulation layer.

10. A method according to claim 9 wherein said step of filling the trench comprises the step of forming a field insulation layer on the substrate to thereby fill the trench and form an insulation-filled trench region.

11. A method according to claim 10 further comprising the step of removing portions of the field insulation layer and portions of the remaining portion of the insulation layer bordered by an insulation-filled trench to expose the substrate and thereby form an active region site.

12. A method according to claim 11 wherein said step of removing portions of the field insulation layer comprises the step of removing one portion of the field insulation layer and one portion of the remain portion of the insulation layer surrounded by an insulation-filled trench to thereby form one active region site surrounded by a insulation-filled trench.

13. A method according to claim 11 wherein said step of removing portions of the field insulation layer comprises the step of removing a plurality of portions of the field insulation layer and a corresponding plurality of portions of the remaining portion of the insulation layer bordered by an insulation-filled trench region to form a plurality of active region sites partially bordered by the insulation-filled trench region.

14. A method of fabricating trenches in an integrated circuit substrate, the method comprising the steps of:
    forming a first layer on the substrate;
    forming a mask region on the first layer;
    removing portion s of the first layer adjacent and underlying edge portions of the mask region to thereby undermine edge portions of the mask region and leave a portion of the first layer underlying the mask region;
    forming a second layer on the substrate, extending to underlie undermined portions of the mask region;
    forming a first region and a second region of different materials from the second layer, the first region positioned beneath undermined portions of the mask region and adjacent the remaining portion of the first layer and the second region positioned adjacent the first region, opposite the remaining portion of the first layer;
    removing the mask region to expose the first region and the remaining portion of the first layer; and removing the first region and underlying portions of the substrate to form a trench between the second region and the remaining portion of the first layer, the trench extending into the substrate.

15. A method according to claim 14 wherein said step of forming a first region and a second region comprises the step of:
    selectively oxidizing portions of the second layer to leave a first region underlying the mask region, and to form a second region disposed adjacent the first region, opposite the remaining portion of the first layer.

16. A method according to claim 15 wherein said step of forming a second layer comprises the step of forming a second layer on the substrate extending at least halfway up sidewall portions of the remaining portion of the first layer.

17. A method according to claim 14 further comprising the step of filling the trench with material to form a filled trench between the second region and the remaining portion of the first layer.

18. A method according to claim 17 wherein said step of filling the trench comprises the step of forming a third layer on the substrate to thereby fill the trench.

19. A method of fabricating active region sites in an integrated circuit substrate, comprising the steps of:

forming a first layer on the substrate; forming spaced apart mask regions on the first layer;

removing portions of the first layer adjacent and underlying edge portions of the mask regions to thereby undermine edge portions of the mask regions and leave a plurality of portions of the first layer, a respective one of the remaining portions of the first layer underlying a respective one of the mask regions;

forming first regions, a respective one of the first regions underlying undermined edge portions of and surrounding a respective one of the mask regions, and a second region adjacent the first regions, opposite the remaining portions of the first layer;

removing the mask regions;

removing the first regions and underlying portions of the substrate to thereby form a plurality of trenches in the substrate, a respective one of the trenches surrounding a respective area of the substrate;

forming a field insulation layer on the substrate to fill each of the plurality of trenches and thereby form a plurality of insulation-filled trench regions, a respective one of the insulation-filled trench regions surrounding a respective portion of the field insulation layer;

removing a respective portion of the field insulation layer surrounded by a respective one of the insulation-filled trench regions to thereby form a plurality of active region sites, a respective one of the active region sites being surrounded by a respective one of the insulation-filled trench regions.

20. A method according to claim 19 further comprising the step of removing a second plurality of portions of the field insulation layer, each positioned outside of the areas of the field insulation layer enclosed by the insulation-filled trench regions, to thereby form a second plurality of active region sites, each positioned outside of the areas enclosed by the insulation-filled trench regions and partially bordered by the insulation-filled trench regions.

21. A method of fabricating active region sites in an integrated circuit substrate, comprising the steps of:

forming a first layer on the substrate;

forming a mask region having two spaced apart edges, on the first layer;

removing portions of the first layer adjacent and underlying edge portions of the mask region adjacent the two spaced apart edges to thereby undermine the edge portions of the mask region and leave a portion of the first layer underlying the mask region, disposed between the two spaced apart edges;

forming a first region underlying the undermined edge portions of the mask region, and a second region adjacent the first regions, opposite the remaining portion of the first layer;

removing the mask region;

removing the first region and underlying portions of the substrate to thereby form a pair of spaced apart trenches in the substrate;

forming a field insulation layer on the substrate to fill each of the pair of trenches and thereby form a pair of spaced apart insulation-filled trench regions; and removing a plurality of portions of the field insulation layer between the pair of insulation-filled trench regions to thereby form a plurality of active region sites between the pair of insulation-filled trench regions, each of the active region sites being partially bordered by one of the insulation-filled trench regions and by an adjacent one of the active region sites.

* * * * *